(12) United States Patent
Goldmann et al.

(10) Patent No.: US 6,342,407 B1
(45) Date of Patent: Jan. 29, 2002

(54) LOW STRESS HERMETIC SEAL

(75) Inventors: Lewis Sigmund Goldmann, Bedford; Eric Daniel Perfecto, Poughkeepsie, both of NY (US); Raed A. Sherif, Woodland Hills, CA (US); William Frederick Shutler; Hilton T. Toy, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/731,619

(22) Filed: Dec. 7, 2000

(51) Int. Cl.[7] .................. H01L 21/44; H01L 21/48; H01L 21/50
(52) U.S. Cl. ............... 438/124; 438/125; 438/119; 438/126
(58) Field of Search ................. 438/124, 125, 438/107, 108, 126, 15

(56) References Cited

U.S. PATENT DOCUMENTS

| | | | |
|---|---|---|---|
| 4,315,591 A | | 2/1982 | Houston |
| 5,059,553 A | * | 10/1991 | Berndlmaier et al. ........ 437/183 |
| 5,069,978 A | | 12/1991 | Mizuhara |
| 5,201,456 A | | 4/1993 | de Reynal et al. |
| 5,881,945 A | * | 3/1999 | Edwards et al. ......... 228/124.6 |
| 5,931,222 A | | 8/1999 | Toy et al. |
| 6,046,074 A | | 4/2000 | McHerron et al. |
| 6,107,109 A | * | 8/2000 | Akram et al. ................. 438/15 |

FOREIGN PATENT DOCUMENTS

JP  6140527  5/1994

OTHER PUBLICATIONS

IBM TDB vol. 29, No. 11, Apr. 1987, p. 5088, of Arndt et al, "Flexible Leaded Chip Carrier".
IBM TDB vol. 27, No. 3, Aug. 1984, p. 1701, of Olah et al, "Hermetic Seal For Semiconductor Package".
IBM TDB vol. 27 No. 1A, Jun. 1984, p. 129, of Bakos et al, "Method For Low Temperature Module Encapsulation".

* cited by examiner

*Primary Examiner*—David Nelms
*Assistant Examiner*—Thao P. Le
(74) *Attorney, Agent, or Firm*—Graham S. Jones, II; Ira D. Blecker

(57) ABSTRACT

A sealed electronic circuit module includes a ceramic chip carrier with a top surface, a cover having a mating surface and a seal at the periphery of the carrier between the carrier and the cover. The seal includes a non-metallic soft lower frame, preferably polyimide, atop the carrier at the periphery of the carrier. There is an upper adhesion layer shaped as a matching an upper frame facing downwardly from the cover towards the lower frame. Above the soft lower frame is a lower metal adhesion layer. Between the upper frame and the lower adhesion layer is a solder layer which has been heated to seal the cover to the chip carrier. The soft frame can include a channel through which a metal to metal via-seal is formed by the lower metal adhesion layer and the solder through the channel through the soft layer or there can be a lateral extension of the lower metal adhesion layer to a distal location beyond the periphery of the soft lower frame.

20 Claims, 7 Drawing Sheets

LOW STRESS HERMETIC SEAL

BACKGROUND OF THE INVENTION

1. Field of the Invention

This invention relates to semiconductor packages and more particularly to methods for hermetically sealing such packages and to the resultant hermetically sealed packages.

2. Description of Related Art

FIG. 1 is a schematic diagram of a cross-section of a fragment of a semiconductor module 10 of the kind shown in U.S. Pat. No. 6,046,074 of D. C. McHerron and H. T. Toy, commonly assigned, for "Hermetic Thin Film Metallized Sealband for SCM and MCM-D Modules". FIG. 1 illustrates a common method of hermetically sealing a protective cap 12 (with a top 13 and with sides 27 which have vertical sidewalls 28) to a chip carrier 14 with a sealing structure 31 at the periphery of the chip carrier 14. The sealing structure 31 comprises a layer of solder 52 between a thin film (carrier) sealband 32 and a cap sealband 42. The cover and carrier sealbands 32/42, which are composed of sequentially applied thin metal sealing layers, are hermetically sealed together by the solder layer 52. The all metal peripheral sealing structure 31 transmits high stress to the top surface 14T of the chip carrier 14, due to the rigidity of the solder 52 and the sealbands 32/42 and due to the thermal expansivity mismatch between the metals in the sealing structure 31 and the chip carrier 14, e.g. a ceramic chip carrier. On the one hand, the chip carrier 14 can be composed of relatively strong materials such as alumina ceramics which are able to withstand the high stress. On the other hand, weaker materials such as glass-ceramics may develop stress cracks along the periphery of the seal 31 from sealing or from subsequent thermal cycling. Therefore, for such relatively weak materials as glass-ceramics, the problem is to devise a relatively inexpensive method for hermetically sealing a protective cap 12 to a chip carrier 14 where stress transmitted to the chip carrier 14 is a major issue.

Japanese Patent JP6140527 deals with hermetic sealing device component, wherein an AlN (Aluminum Nitride) circuit substrate is connected by brazing it to a metal frame while interposing a soft metal frame member.

IBM TDB Vol. 29, No. 11, April 1987, p 5088, of Arndt et al., "Flexible Leaded Chip Carrier" describes a second level attachment process for replacing pins with a flexible connection from TSM (Top Surface Mounted) surface pads which wind around the sides of the ceramic base plate (substrate) to the bottom of the ceramic base plate. A ceramic lid assures an hermetically sealed package". A flexible polyimide (PI) lead minimizes stress on the surface solder board connection. The ceramic base plate provides dimensional stability.

U.S. Pat. No. 5,881,945, Edwards et al. "Multi-Layer Solder Seal Band for Semiconductor Substrates and Process", commonly assigned, describes a multilayer three layer, all metallic sealing structure, but specifies all layers of the seal are metal in which the height of the seal is increased. The thick middle layer of the sealing structure, which has a relatively higher melting point than the outer layers, can be a lead/tin, lead/indium or tin/bismuth solder material. The top and bottom layers of the sealing structure, which have a relatively lower melting point than the middle layer can be lead/tin, lead/indium, or tin/bismuth solder materials. This makes the sealing structure more resistant to fatigue from CTE (Coefficient of Thermal Expansion) mismatch between the cap and the carrier. We have found that this type of sealing structure can cause substrate cracks adjacent to the seal band when a weaker substrate material such as glass-ceramic is used.

U.S. Pat. No. 5,201,456, Reynal et al. "Process for Assembly of a Metal Can on a Substrate Bearing an Integrated Circuit" U.S. Pat. No. 5,201,456 teaches sealing a metal can to a substrate with a multi-layer seal. The metal can is formed by a metal frame with a metal cap sealed thereto by welding. The seal is comprised of a dielectric layer, a transition layer, and a metal layer. The transition layer is a mixture, of dielectric and metal (approximately 50/50). The purpose is to provide an "air-tight", stress resistant seal and to provide electrical isolation of the lid from underlying conductive lines ("strip conductors"). The seal contains conductive lines.

U.S. Pat. No. 5,069,978 Mizuhara "Brazed Composite Having Interlayer of Expanded Metal" teaches brazing plates (e.g. chip carrier and cover) of dissimilar materials with a metal interlayer. The interlayer is formed into a slit, creased geometry, such that it offers a compliant connection, and is brazed on either side to the two plates. At any rate, it talks nothing about dual seal bands or polymers.

U.S. Pat. No. 4,315,591, Houston, "Method for Thermo-Compression Diffusion Bonding A Structured Copper Strain Buffer to Each Side of a Substrateless Semiconductor Wafer" teaches a thermo-compression diffusion bonding process whereby copper strain buffers are attached to opposite sides of a wafer.

IBM TDB Vol. 27, No. 3, (Aug. 1984) p 1701, of Olah et al. "Hermetic Seal for Semiconductor Package" describes a process for attaching non-metallic gaskets hermetically to porous substrates by mechanically clamping.

IBM TDB Vol. 27, No. 1A (June 1984), p. 129, of Bakos et al. "Method for Low Temperature Module Encapsulation" describes a U-channel sealing scheme, with a low melt solder fill. The bismuth-based solder composition specified has a negative CTE, so that on cooling additional pressure is applied to the inside of the channel and the legs of the cap.

U.S. Pat. No. 5,931,222 of Toy, Edwards, Shih and Giri for "Adhesion Promoting Layer for Bonding Polymeric Adhesive to Metal and a Heat Sink Assembly Using Same" describes adhesion of a heat sink to the top surface of a nickel plated metal cap. The heat sink is adapted for cooling chips on a chip carrier. A hermetic sealing structure is formed at bottom edges of the cap which are nickel plated to the multi-chip carrier. A bottom seal band of nickel/gold layers is formed on the top surface of the chip carrier. The seal is formed by lead/tin solder between the nickel plated surface of the cap and the bottom seal band on the chip carrier. For the heat sink, the top of the cap is coated with a thin adhesion promoting metal film such as chromium or titanium. The heat sink is attached in a non-hermetic fashion to the thin adhesion-promoting metal film by a polymeric heat sink adhesive, such as a silicone elastomer material, which provides an interfacial bond between the top of the cap and a polymeric adhesive.

Previous glass-ceramic products which required hermetic sealing have used mechanical seals, such as solder coated C-rings. With associated required hardware, these tend to be more expensive and require more board real estate than the present invention. Also a C-ring seal requires an ultra-flat surface which translates to an expensive surface planarization process. In the present invention the thicker solder later (perhaps 100 micrometers) is able to absorb substrate out-of-flatness.

SUMMARY OF THE INVENTION

Unlike Japanese Patent JP6140527, this invention does not involve a frame, but replaces a "soft metal" (presumably a soft solder) with a thin stress-absorbent polymer, which is nearly hermetic, and can be made fully hermetic with a solder filled channel through the polymer.

As contrasted with U.S. Pat. No. 5,881,945, Edwards et al., a polymer layer is positioned adjacent to the chip carrier.

This invention differs from U.S. Pat. No. 5,201,456 of Reynal et al. in several regards as follows:
1. The surface to which sealing is made contains no conductive lines or features.
2. The seal contains just a polymer and metal without any transition layer.
3. This invention includes the option of having one layer "shared" by the metal and polymer via a channel.

Hermetic sealing has been an established art for the most common electronic chip carrier materials, but remains an expensive real-estate-costly process for glass-ceramic until this invention.

In accordance with this invention, a method is provided for forming a sealed electronic circuit package comprising the following steps. Provide a substrate having a top surface and a cover having a mating surface confronting the top surface of the substrate. Form a seal at the peripheral edge of the substrate between the substrate and the mating surface of the cover by the following steps. Forming a peripheral substrate non-metallic soft frame formed on the top surface of the substrate having a top soft frame surface which faces upwardly. Provide cover frame surface on the mating surface of the cover which is exposed downwardly. Form a lower adhesion frame over the soft frame, and join the top surface of the lower adhesion frame and the cover frame surface with solder to form a hermetic via-seal to the substrate frame surface forming a seal between the cover frame surface and the substrate.

One can employ a solder selected from the group consisting of an (SnAg or a SnAgCu solder with about 96%Sn) or a two-material (lead/tin eutectic) solder plus a polymer seal instead of a channel filled with solder.

Preferably, the solder has a melting point 30° C. to 40° C. below the melting point or the glass transition temperature $T_g$ of any polymer or the melting point of any solder in the module or package.

Preferably, the channel and the via-seal are located laterally aside from the confronting portions of the surfaces of the cover and the substrate; the via-seal is exposed on the surface of the soft layer on an exterior surface of the peripheral substrate frame; or the via-seal is exposed on the surface of the soft layer on an interior surface of the peripheral substrate frame; the substrate is a ceramic chip carrier and the soft layer is a polymer; the substrate is a ceramic or glass ceramic chip carrier and the soft layer is a polymer, preferably polyimide; the lower adhesion frame is composed of laminated Cr-Ni-Au layers; the soft layer has a thickness preferably less than or equal to about 12 $\mu$m.

Preferably, form the non-metallic soft frame with a central channel extending down through the non-metallic soft layer to expose a portion of the substrate frame surface below the channel with the lower adhesion frame extending down through the channel formed in the non-metallic soft layer to contact the substrate surface, whereby the hermetic via-seal extends through the channel to the substrate frame surface to form a seal between the cover frame surface and the substrate.

Preferably, form the lower adhesion frame with an extension across the edge of the non-metallic soft layer to contact the substrate surface at a distal location, so the hermetic via-seal extends across the edge of the soft layer to form a seal between the cover frame surface and the substrate.

In accordance with another aspect of this invention, the method comprises forming a sealed electronic circuit package by providing a substrate having a top surface and a cover having a mating surface confronting the top surface of the substrate. Form a seal at the peripheral edge of the substrate between the substrate and the mating surface of the cover by the following steps. Form a peripheral substrate non-metallic soft frame formed on the top surface of the substrate having a top soft frame surface which faces upwardly with a central channel formed down through the non-metallic soft layer to expose a portion of the substrate frame surface below the channel. Form a cover frame for providing adhesion formed on the mating surface of the cover, the cover frame having a cover frame surface which is exposed downwardly. Form a lower adhesion frame over the soft frame extending down through the channel formed in the non-metallic soft layer to contact the substrate surface. Join the top surface of the lower adhesion frame and the cover frame surface with solder and extending into the channel to form a hermetic via-seal through the channel to the substrate frame surface form a seal between the cover frame surface and the substrate extending through the channel in the soft frame.

One can employ a solder selected from the group consisting of an (SnAg or a SnAgCu solder with about 96%Sn) or a two-material (lead/tin eutectic) solder plus a polymer seal instead of a channel filled with solder.

Preferably, the solder has a melting point 30° C. to 40° C. below the melting point or the glass transition temperature $T_g$ of any polymer or the melting point of any solder in the module or package.

In accordance with another aspect of this invention sealed electronic circuit package is provided comprising a substrate having a top surface, a cover having a mating surface confronting the top surface of the substrate, a seal at the peripheral edge of the substrate between the substrate and the mating surface of the cover. The seal includes a peripheral substrate non-metallic soft frame formed on the top surface of the substrate having a top soft frame surface which faces upwardly, a cover frame for providing adhesion formed on the mating surface of the cover, the cover frame having a cover frame surface which is exposed downwardly, a lower adhesion frame formed over the soft frame extending, and solder joining the top surface of the lower adhesion frame and the cover frame surface to form a hermetic via-seal.

Preferably the channel and the via-seal are located laterally aside from the confronting surfaces of the cover and substrate; with the via-seal exposed on the surface of the soft layer on an exterior surface of the peripheral substrate frame; the via-seal is exposed on the surface of the soft layer on an interior surface of the peripheral substrate frame; the substrate is a ceramic or glass ceramic chip carrier and the soft layer is a polymer preferably comprising polyimide; the lower adhesion frame is composed of laminated Cr-Ni-Au layers; and the soft layer has a thickness less than or equal to about 12 $\mu$m. Preferably the non-metallic soft frame having a central channel formed down through the non-metallic soft layer to expose a portion of the substrate frame surface below the channel with the lower adhesion frame extending down through the channel formed in the non-metallic soft layer to contact the substrate surface, whereby the hermetic via-seal extends through the channel to the substrate frame surface to form a seal between the cover frame surface and the substrate. Preferably, the lower adhesion frame extends across the edge of the non-metallic soft layer to contact the substrate surface at a distal location, whereby the hermetic via-seal extends across the edge of the soft layer to form a seal between the cover frame surface and the substrate.

One can employ a solder selected from the group consisting of an (SnAg or a SnAgCu solder with about 96%Sn) or a two-material (lead/tin eutectic) solder plus a polymer seal instead of a channel filled with solder.

Preferably, the solder has a melting point 30° C. to 40° C. below the melting point or the glass transition temperature $T_g$ of any polymer or the melting point of any solder in the module or package.

In accordance with another aspect of this invention, a sealed electronic circuit package comprises a substrate having a top surface, a cover having a mating surface confronting the top surface of the substrate, a seal at the peripheral edge of the substrate between the substrate and the mating surface of the cover, the seal including a)a non-metallic soft layer formed the top surface of the substrate for providing adhesion, at the peripheral edge of the substrate, the substrate frame having a top surface facing upwardly, b)a cover frame for providing adhesion formed on the mating surface of the cover having a cover frame surface facing downwardly, c) an intermediate adhesion layer formed on the upper surface of the soft layer, the intermediate adhesion layer having an upper surface, and d) solder formed between the intermediate adhesion layer upper surface and the cover frame surface.

Preferably the sealed electronic circuit package comprises a substrate having a top surface, a cover having a mating surface confronting the top surface of the substrate, a seal at the peripheral edge of the substrate between the substrate and the mating surface of the cover. The seal includes a) a peripheral substrate non-metallic soft frame formed on the top surface of the substrate having a top soft frame surface which faces upwardly with a central channel formed down through the non-metallic soft layer to expose a portion of the substrate frame surface below the channel, b) a cover frame for providing adhesion formed on the mating surface of the cover, the cover frame having a cover frame surface which is exposed downwardly, c) a lower adhesion frame formed over the soft frame extending down through the channel formed in the non-metallic soft layer to contact the substrate surface, and d) solder joining the top surface of the lower adhesion frame and the cover frame surface and extending into the channel to form a hermetic via-seal through the channel to the substrate frame surface form a seal between the cover frame surface and the substrate extending through the channel in the soft frame.

BRIEF DESCRIPTION OF THE DRAWINGS

The foregoing and other aspects and advantages of this invention are explained and described below with reference to the accompanying drawings, in which:

FIG. 3A is a sectional view of the device of FIG. 2 in an early stage of the process after formation of a soft, polymeric cushion-frame on the surface of the chip carrier.

FIG. 3B shows the device of FIG. 3A after formation of a central channel in the soft, polymeric cushion-frame.

FIG. 3C shows the device of FIG. 3B after formation of a thin metal lower adhesion frame on the surface of the soft, polymeric cushion-frame which conforms to the surface of cushion-frame extending down into and across the central channel.

FIG. 3D shows the device of FIG. 3B after a solder frame preform has been placed upon the upper surface of the thin metal lower adhesion frame leaving an upper, via-seal channel directly above the central channel.

FIG. 3E shows the device of FIG. 3D after a solid, solder-frame preform has been heated above its melting point to form a molded solder frame providing the hermetic seal seen in FIG. 2.

FIG. 4E shows the view of the module preceding heating of the solder preform to create the solder frame providing the hermetic seal seen in FIGS. 2 and 3E.

DESCRIPTION OF THE PREFERRED EMBODIMENT

Figure 1:
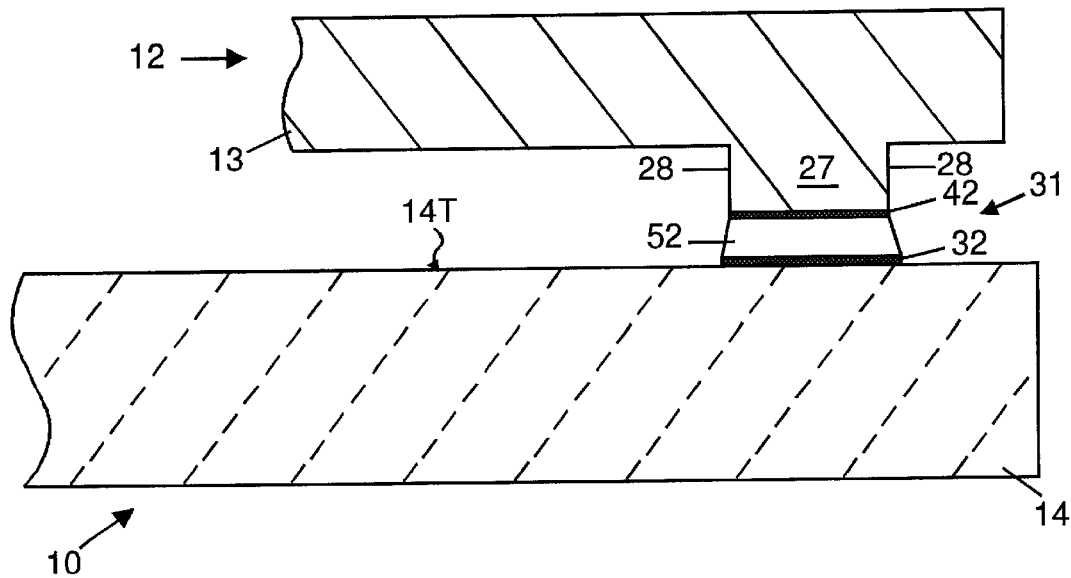
FIG. 1 is a schematic diagram of a cross-section of a fragment of a semiconductor prior art module.
Figure 2:
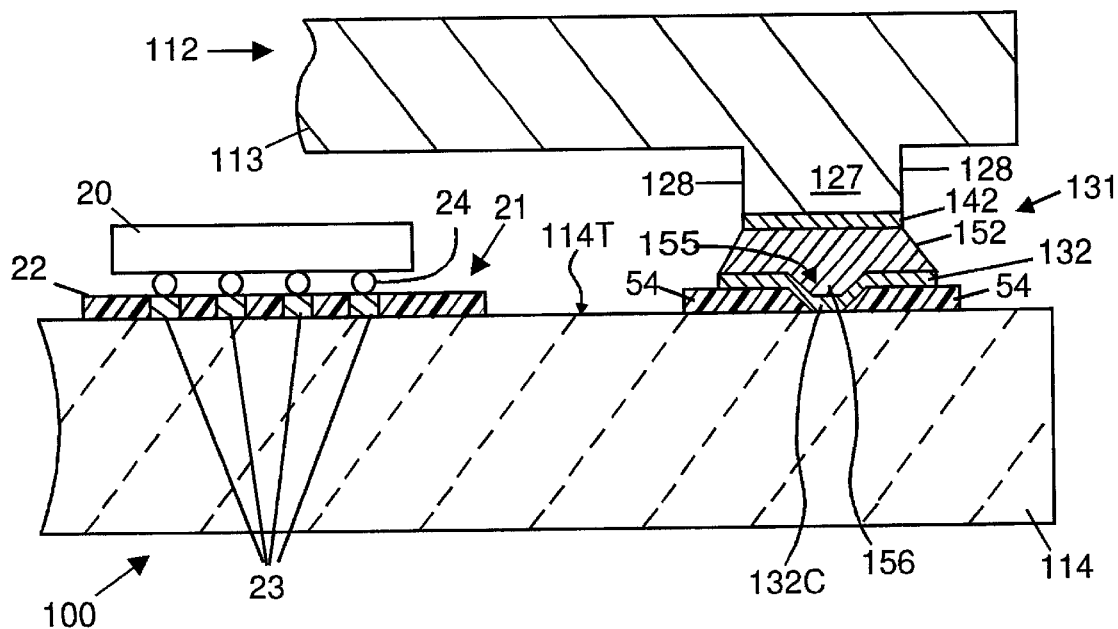
FIG. 2 is a schematic diagram a cross-section of a fragment of a semiconductor module illustrating the structure of a hermetic sealing structure with a central sealing channel in accordance with a preferred embodiment of this invention.

FIG. 2 is a schematic diagram a cross-section of a fragment of a semiconductor module 100 illustrating the structure of a preferred embodiment of this invention. The module 100 includes a chip carrier 114 and a rectangularly shaped chip cover 112, fragments of which are shown bonded together. The chip cover 112 has a top 113 and four vertical sides 127. The sides 127, which have vertical sidewalls 128, are joined at their bottoms surfaces to the periphery of the top surface of the chip carrier 114 by a hermetic sealing structure 131. That is to say that thee hermetic sealing structure 131 is formed between bottoms of the sides 127 of cover 112 and the border of the top surface of the chip carrier 114, in accordance with this invention. A via-seal 156 is formed by solder 152 which is located in a position that is remote from the high-stress edges of the lower adhesion frame 132. The solder 152 which fills a narrow via-seal channel 155 is separated from the high-stress edges of the lower adhesion frame 132 by a soft, polymeric cushion-frame 54. This separation between the solder and the high stress edges is provided to protect the chip carrier 114 from the stresses generated between the solder and the high stress edges of the lower adhesion frame 132.

Inside the cover 112, a electronic-circuit-bearing, semiconductor chip 20 is shown supported by an optional interconnect structure 21 which is formed on the surface of the chip carrier 114. In this embodiment, the interconnect structure 21 comprises an insulating layer 22 which has metal vias 23 extending from the top surface of layer 22 to contacts (not shown) in the chip carrier 114. The chip 20 (which may represent just one of a plurality of chips 20 formed in an x-y array as seen in FIG. 4E, is connected to the vias 23 in the interconnect structure 21 by connectors which are shown as C4 solder ball junctions 24 in this embodiment of the invention.

The hermetic sealing structure 131 is provided to protect the chip or a plurality of chips 20 or other elements and the circuits on the surface of the chip carrier 114 which need to protected from the ambient atmosphere outside of the module 100.

FIGS. 3A–3E illustrate the process flow of forming the hermetic sealing structure 131 of FIG. 2 in accordance with this invention.

Figure 3A:
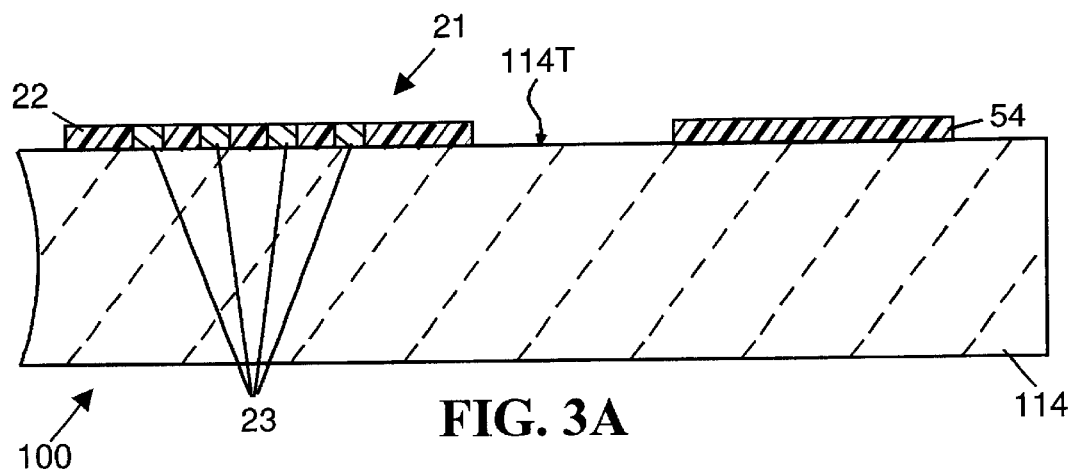
FIGS. 3A–3E show the process flow for formation of the semiconductor module illustrating of FIG. 2. with a hermetic sealing structure of FIG. 2 in accordance with this invention.

FIG. 3A is a sectional view of the device 100 of FIG. 2 in an early stage of the process after formation of a soft, polymeric cushion-frame 54 on the surface of the chip carrier 114.

Figure 3B:
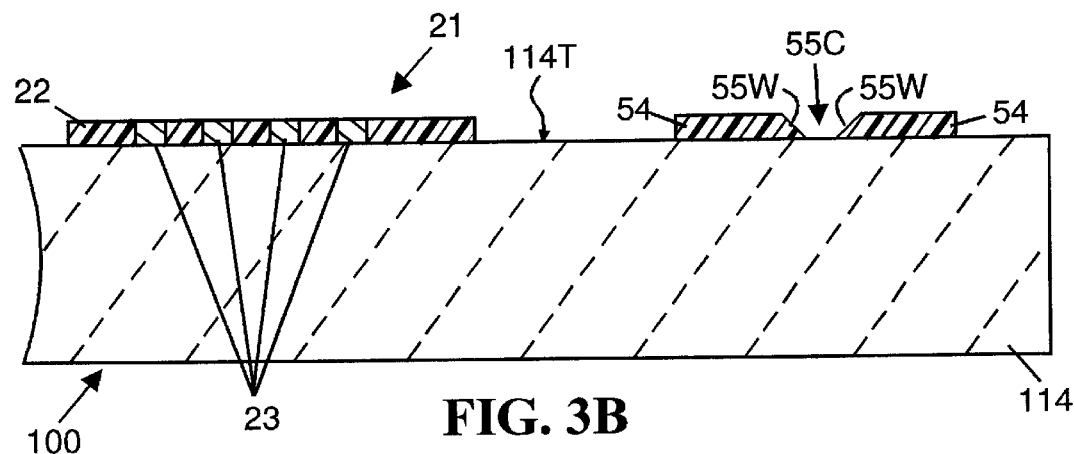

FIG. 3B shows the device 100 of FIG. 3A after formation of a central channel 55C in the soft, polymeric cushion-frame 54. The soft, polymeric cushion-frame 54 (preferably a material such as polyimide) is formed directly upon the chip carrier 114. The soft, polymeric cushion-frame 54 and the metal lower adhesion frame 132 provide physical separation and decoupling of the solder frame preform 152 in the sealing structure 131 from the chip carrier 114.

Figure 3C:
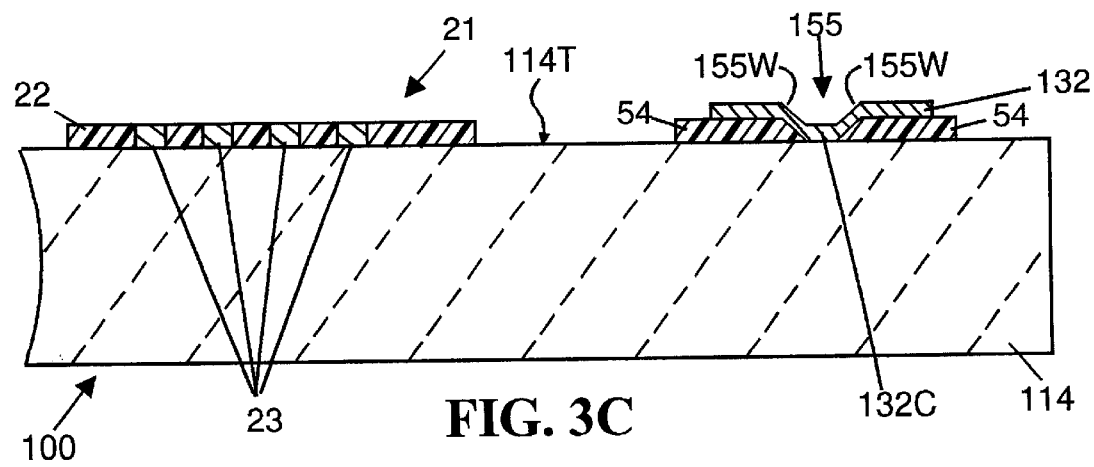

FIG. 3C shows the device 100 of FIG. 3B after formation of a thin metal lower adhesion frame 132 on the surface of the soft, polymeric cushion-frame 54 which conforms to the surface of cushion-frame 54 extending down into and across the central channel 55C, forming an upper, via-seal channel 155. The via-seal channel 155 (which provides space for solder 152 in FIGS. 2 and 3E) is formed by projection of the metal lower adhesion frame 132 through the contact channel 55C (shown in FIG. 3B as mentioned above) in the center of the soft, polymeric cushion-frame 54. Thus a hermetic seal is provided by the metal to substrate contact 132C since the thin metal lower adhesion frame 132 directly contacts the chip carrier 114.

Figure 3D:
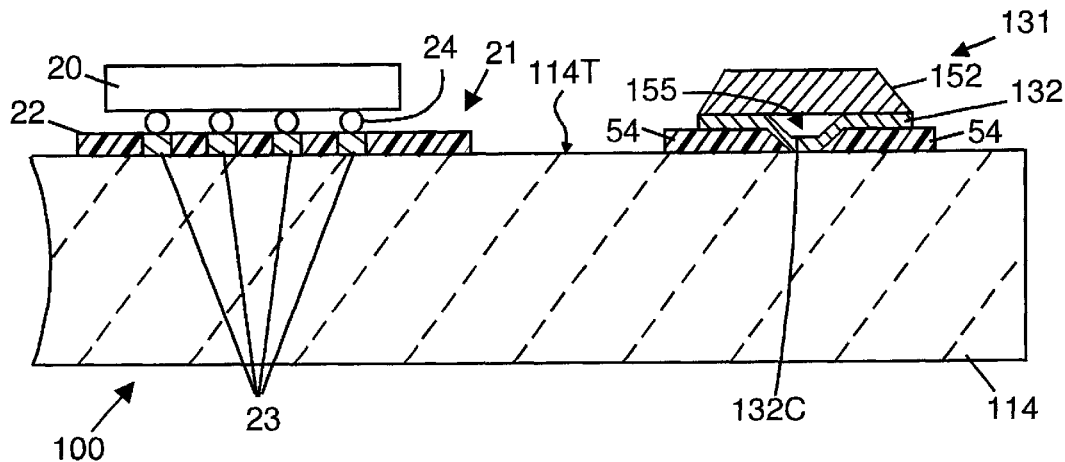

FIG. 3D shows the device 100 of FIG. 3B after a solder frame preform 152 has been placed upon the upper surface of the thin metal lower adhesion frame 132 leaving an upper, via-seal channel 155 directly above the central channel 55C.

Figure 3E:
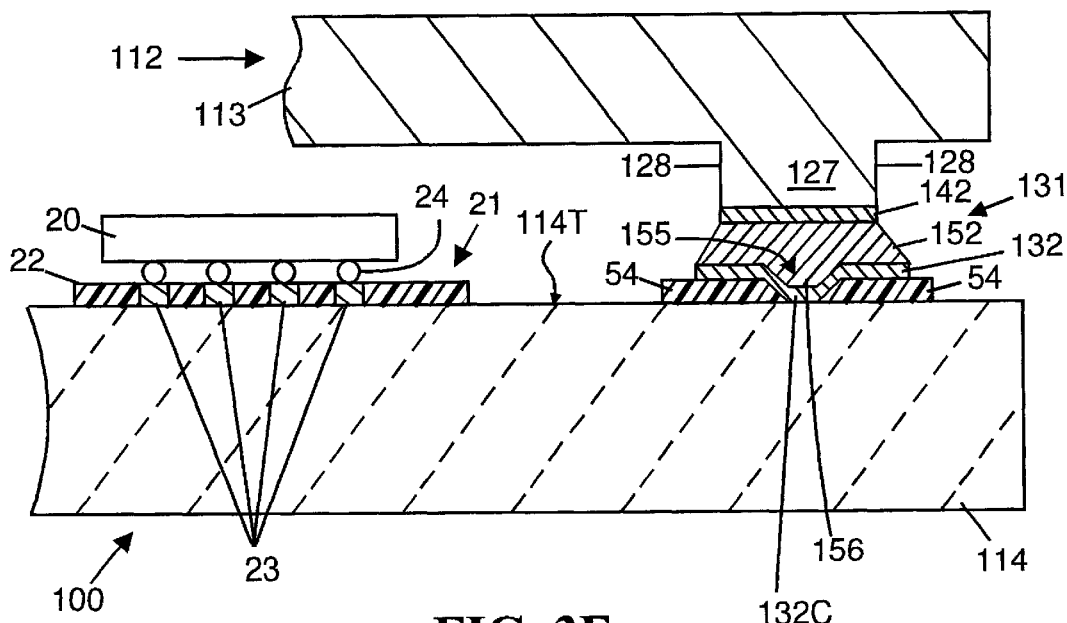

FIG. 3E shows the device 100 of FIG. 3D after the solder frame preform 152 has been heated to its melting point so that the solder frame preform 152 melts and flows down into the upper, via-seal channel 155 (shown in FIGS. 3C and 3D) forming a solder frame 152' conforming with the surface of the metal lower adhesion frame 132. A metal cover adhesion frame 142, which is formed on the bottom of the sides 127 of the cover 112, is bonded to the solder frame 152'. The solder frame 152', which fills the via-seal channel 155 has formed a metal via-seal 156 is formed in the channel 155 by the heating of the solder frame preform 152 until it melts thereby filling the via-seal channel 155 midway between the outer and inner edges of the soft, polymeric cushion-frame 54. The solder frame 152' forms the metal-to-metal via-seal 156 in the channel 155 above the thin metal lower adhesion frame 132. Note that the metal cover adhesion frame 142 is formed on the bottom surfaces at the bases of the four sides 127 of the cap 112 confronting the solder frame preform 152 and thus provides full hermeticity. The via-seal 156, formed by the solder frame 152' filling the via-seal channel 155, is narrow and the separation provided by the soft, polymeric cushion-frame 54 protects the chip carrier 114 which is remote from the high-stress edges of the lower adhesion frame 132 as can be seen by reference to FIGS. 3A–3C and the text relative found herein below.

Note that the solder frame 152' straddles the contact channel 55C, distancing the edges of the solder frame 152' from the lower adhesion frame 132 which extends through the polymeric layer 54. In addition, the solder frame preform 152 has a low melting point relative to the glass transition temperature $T_g$ of the polymeric layer 54. As used herein, the glass transition temperature $T_g$ of a polymer is the temperature above which there is a sudden change in the chain mobility of a polymer.

FIGS. 3A–3E show the process flow for formation of the device shown in FIG. 2.

FIG. 3A is a sectional view showing module 100 in an intermediate stage of the process which produces the module 100 of FIG. 2. An interconnect structure 21 is shown which comprises an insulating layer 22 with metal, electrically conductive vias 23 therethrough extending from the top surface of the insulating layer 22 to contacts (not shown) in the chip carrier 21.

To the right of the interconnect structure 21 is shown a layer of a soft, non-metallic, polymeric cushion-frame 54 which has been formed on the polished surface of the chip carrier 114. The soft, non-metallic, polymeric cushion-frame 54 preferably comprises a material such as polyimide.

Figure 4A:
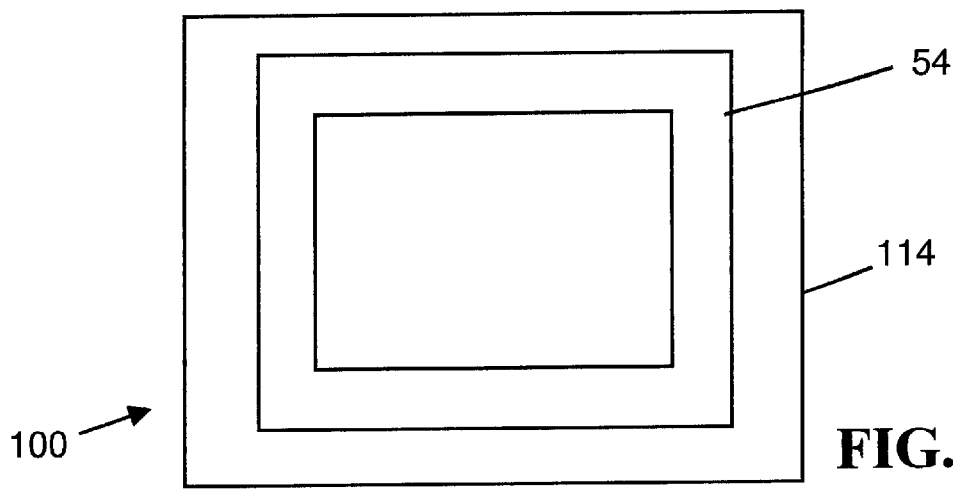
FIG. 4A is a schematic diagram of the semiconductor module of FIG. 3A showing a plan view of an example of a soft, non-metallic, polymer cushion-frame formed on the surface of a chip carrier on a substantially reduced scale from FIG. 3A

FIG. 4A is a schematic diagram showing a plan view of an example of a cushion-frame 54 formed on the surface of a chip carrier 114 on a substantially reduced scale from FIG. 3A.

The cushion-frame 54 is deposited selectively to form the pattern seen in FIG. 3A and FIG. 4A by screen printing or by fabrication as one of the layers employed for providing connections for the C4 solder balls to the carrier 114. It should be noted that for this invention it is not necessary for the dimensions of the cushion-frame 54 to be commensurate with the layers formed thereon which may be narrower.

Figure 4B:
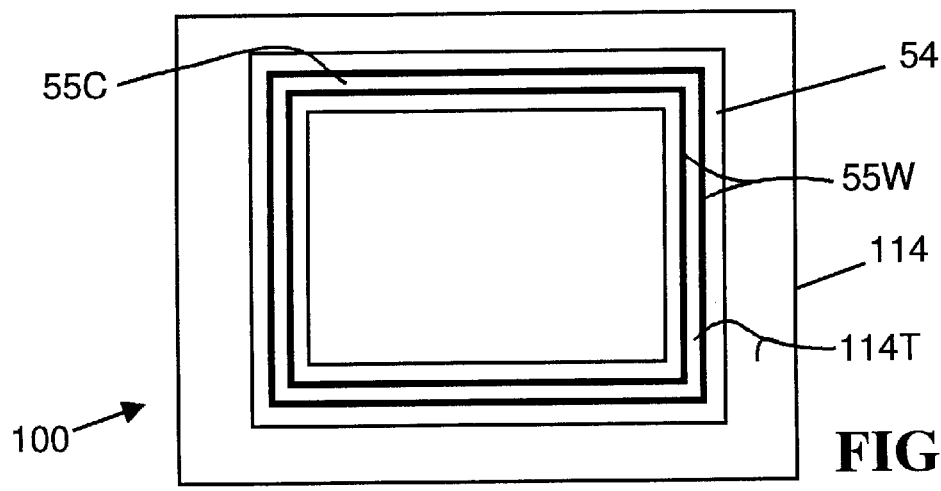
FIG. 4B shows, the semiconductor module of FIG. 4A after the soft, non-metallic, polymer cushion-frame has been grooved to form a contact channel by ablation of a channel lengthwise, down the center of the four walls of the polymer frame, as seen in FIG. 3B.

In FIG. 3B and FIG. 4B, the module 100 is shown after the soft, non-metallic, polymer cushion-frame 54 has been grooved to form the contact channel 55C by ablation of a channel lengthwise, down the center of the four walls of the polymer frame. The ablation process is preferably performed using an excimer laser at a frequency of 308 nm. Then the module 100 is exposed to an oxygen plasma to remove the layer of debris left by the ablation process. The trench 55C has tapered sidewalls 55W formed in the soft, polymeric, cushion-frame 54 so that the trench 55C is narrower at the exposed top surface 114T of the chip carrier 114 than at the top surface of the polymer cushion-frame 54.

FIG. 4B is a schematic diagram showing a plan view of an example of the cushion-frame 54 of FIG. 4A after ablation of a channel 55C exposing the top surface 114T of a chip carrier 114 in the center of the cushion-frame 54. The tapered sidewalls 55W are indicated by the thick lines on the sides of the channel 55C.

Figure 4C:
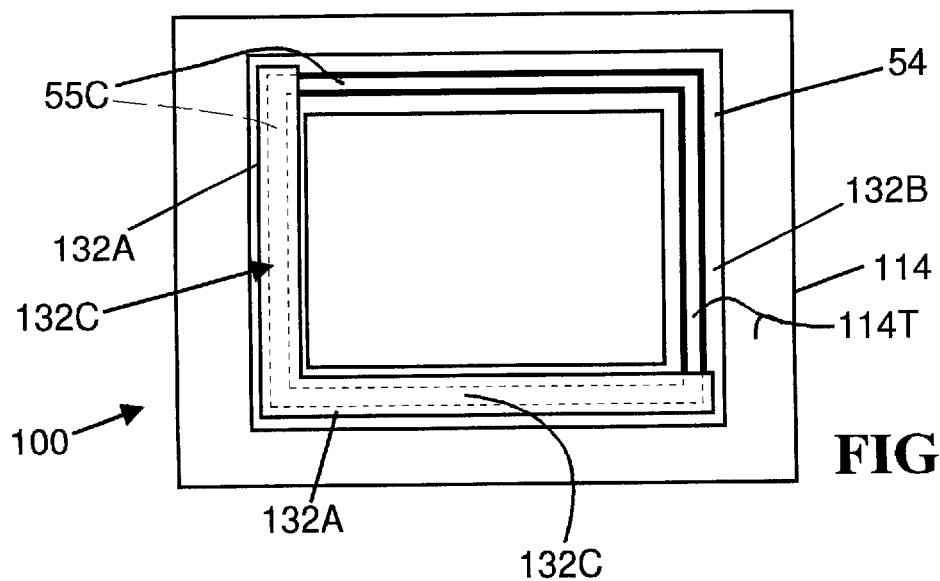
FIG. 4C shows the semiconductor module of FIG. 4A after the formation of a first layer of the adhesion frame with the first layer of the adhesion frame covering the left and bottom portions of the cushion-frame.

FIG. 4C shows the result of forming the first layer 132A of the adhesion frame 132 which covers the left and bottom portions of the cushion-frame 54.

Figure 4D:
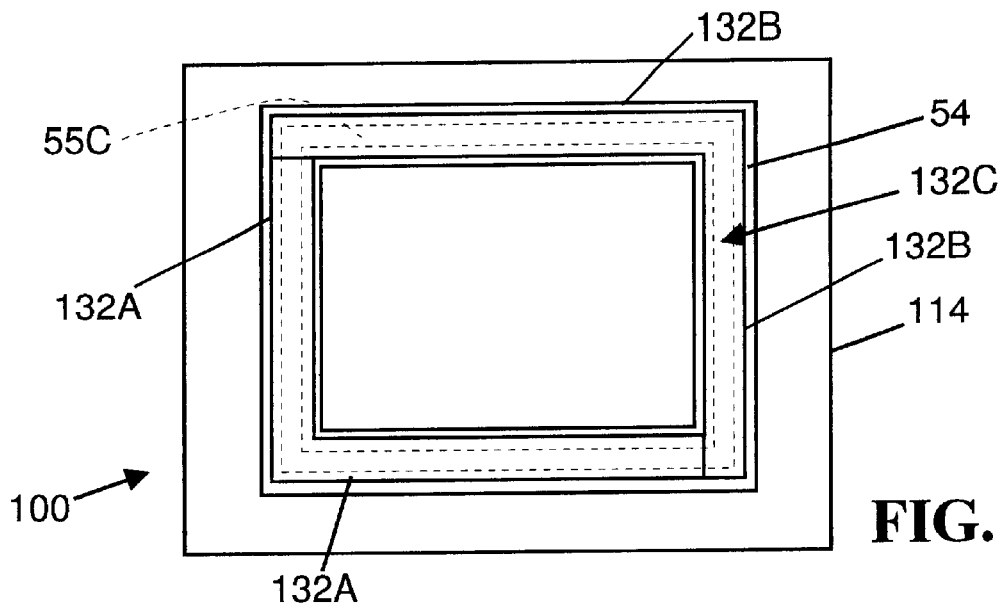
FIG. 4D shows the semiconductor module of FIG. 4C after the formation of a second layer of the adhesion frame with the second layer covering the right and top portions of the cushion-frame with an overlap at the upper left and lower right corners as seen in FIG. 3C.
Figure 4E:
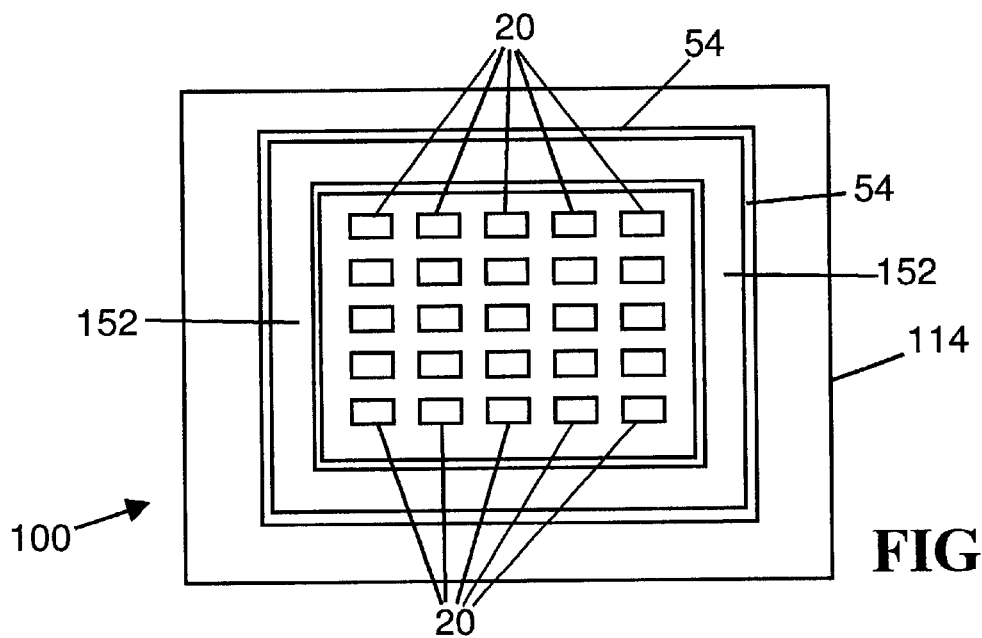
FIG. 4E shows the semiconductor module of FIG. 4D after addition of a solid, solderframe preform to the top surfaces of the lower adhesion frame bridging across the via-seal channel, since the solder is in its solid form and the addition of one or several chips with C4 solder balls resting on the vias in the semiconductor module as seen in FIG. 3D.

FIG. 4D shows the result of forming the second portion 132B of the adhesion frame layer 132 with the second portion 132B covering the right and top portions of the cushion-frame 54, overlapping with first portion 132A at the upper left and lower right corners since the mask used for the evaporation extends to the full x and y dimensions of the completed adhesion frame 132.

FIG. 3C shows the module 100 after the formation of the metal, lower adhesion frame 132 composed to two overlapping complementary patterns 132A and 132B which were formed by evaporation through an L-shaped mask which is used twice to form the entire frame 132.

The metal, lower adhesion frame 132 is preferably composed of Cr/Ni/Au adhesion layers or another suitable combination.

FIGS. 3D and 4E show the module 100 after addition of a solid, solder-frame preform 152 to the top surfaces of the lower adhesion frame 132 bridging across the via-seal channel 155 since the solder is in its solid form and the addition of one or several chips 20 with C4 solder balls 24 resting on the vias 23 in the structure 22.

FIG. 3E shows the module 100 after the solder-frame preform 152 has been reshaped by heating above the melting point of the solder-frame preform 152 to fill the via-seal channel 155 coming into contact with the remainder of the surface of the lower adhesion frame 132. It should be pointed out at this point that the melting and consequent reshaping of the solder-frame preform 152 is usually performed serially, but under rare circumstances can be performed in parallel with the forming of C4 solder bonds to the vias 23.

The reshaped solder-frame preform 152 combined with the lower adhesion frame 132 form a metal structure reaching down through the channel 55C in the soft cushion-frame 54 to contact the chip carrier 114.

The method used to apply the solder to the surface of the soft layer structure is to flux the lower adhesion frame (sealband) 132. Then the is placed over the fluxed sealband 132. Next, the module 100 (without its cover which is to be added later) is placed in a furnace to reflow the solder in the solder-frame preform 152. Then the part is cleaned.

In FIG. 3E, the module 100 is shown after the joining of the cover 112 and the cover adhesion frame 142 to the solder-frame preform 152. The cover adhesion frame 142 is bonded to the carrier of the sidewall 128 of the cap 112 prior to joining the cover 112 to the solder-frame preform 152. The cover adhesion frame 142 may be composed of layers comprising Ni-Au or another suitable combination, as described above.

The cover 112 is positioned with the metal cover adhesion frame resting on the solder preform 152. Then the module 100 is heated above the melting point of the preform 152 to provide a hermetically sealed bond between the metal lower adhesion frame 132 and the metal cover adhesion frame 142.

Thus the metal cover adhesion frame 142 on the bottom surface at the base of vertical sidewall 128 of the cap 112 is bonded to the top surface of the solder frame preform 152 and thus provides full hermeticity.

Alternatively, the solder-frame preform 152 or its equivalent can be secured to the cap 112 instead of the above described process; or the solder may be cast onto the cap instead of being joined as a preform.

The method used to apply the cap (lid) 112 to the surface of the solder layer 152 is to fixture the lid 112 to the sealband. A load is applied to a pressure of about two pounds. Then the fixtured assembly is placed in a furnace to reflow the solder 152.

The environmental conditions are required to assure that the environment within the package is clean prior to sealing the cap (lid) 112 to the solder layer 152 is for the substrate chip assembly (module 100) which has flux applied is cleaned with a solvent such as xylene or turpene, followed by rinsing in IPA (IsoPropyl Alcohol), DI (deionized) water followed by nitrogen gas ($N^2$) drying and bake operations.

Figure 5A:
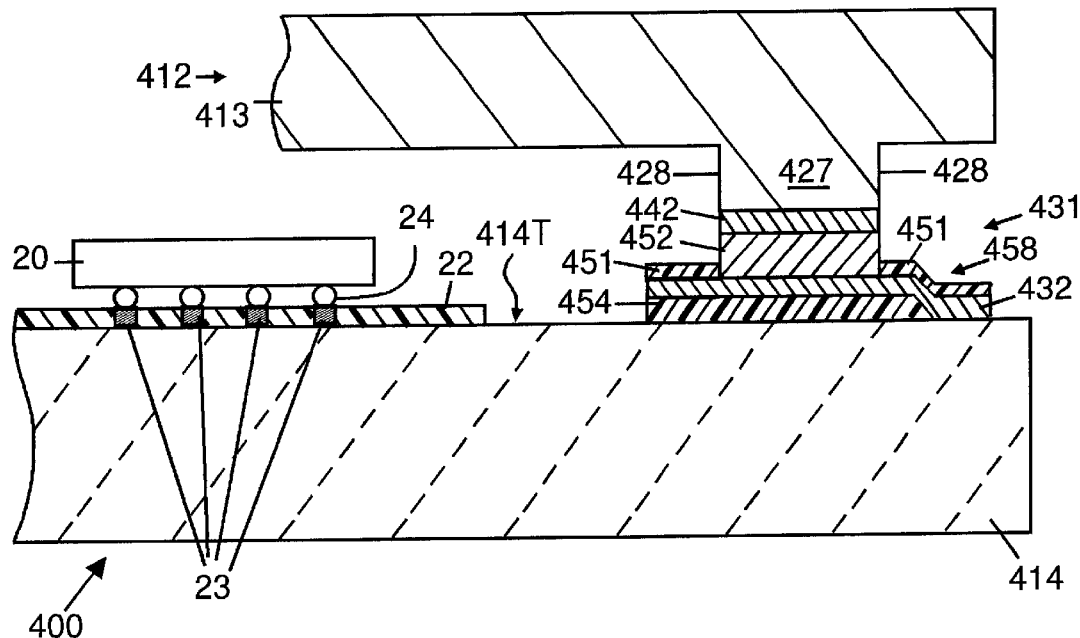
FIG. 5A shows a modification of the embodiment of FIG. 2 in which a solder seal is offset (inboard, but could just as well be outboard) from a metal/chip carrier contact via-seal.

FIG. 5A shows a modification of the embodiment of FIG. 2 in which a solder seal 431 is offset (inboard, but could just as well be outboard) from a metal/chip carrier contact via-seal 458. In this case the via-seal 458 contacts the chip carrier 414 at a distal location on the exterior (outboard) periphery of the polyimide PI polymer cushion-frame 454. As in FIG. 2, the module 400 includes a chip carrier 414 and a chip cover 412 (fragments of which are shown) bonded together and hermetically sealed by a sealing structure 431 in accordance with this invention. The chip carrier 414 supports an interconnect structure 22 and chips 20 as described above.

The chip cover 412 has a top 413 and four vertical sides 427. The sides 427 have vertical sidewalls 428 which are joined to the chip carrier 414 by a hermetic sealing structure 431. The hermetic sealing structure 431 is formed between the sides 427 of cover 412 and the chip carrier 414, in accordance with this invention. A metal cover adhesion frame 442 is formed on the bottom of the vertical sides 427 of the cover. The metal cover adhesion frame 442 may be composed of layers comprising Mo-Ni-Au or another suitable combination, as described above.

The sealing structure 431 employs a soft, polymeric cushion-frame 454 formed on the surface of the chip carrier 414.

A metal lower adhesion frame 432 is formed on the top surface of the cushion-frame 454. Frame 432 extends beyond the edge of the cushion-frame 454 to contact the chip carrier 414 near the periphery thereof. The metal, lower adhesion frame 432 is preferably composed of Cr/Ni/Au adhesion layers or another suitable combination which can bond to the solder preform 452 which is placed above the lower adhesion frame 432.

On the surface of the lower adhesion frame 432 a polymeric mask 451 has been formed and an opening has been formed above the top surface of the metal lower adhesion frame 432 far away from the edge of the cushion-frame 454 to confine molten solder 452 from the solder preform 452 which has provides a hermetically sealed bond between the metal lower adhesion frame 432 and the metal cover adhesion frame 442. Masking layer 451 prevents the solder 452 from contacting the distal portions of the lower adhesion frame 432. Since the molten solder 452 may undercut the polymeric mask 451, it is preferred that the gold portion of the metal lower adhesion frame 432 should be plated to complete frame 432 only after the formation of the polymeric mask 451.

The cover 412 is positioned with the metal cover adhesion frame resting on the solder preform 452. Then the module 400 is heated above the melting point of the preform 452 to provide a hermetically sealed bond between the metal lower adhesion frame 432 and the metal cover adhesion frame 442. Thus the metal cover adhesion frame 442 on the bottom surfaces of the sides 427 of the cap 412 is bonded to the top surface of the solder frame preform 452 and that provides full hermeticity.

In this case, there is no contact between solder frame preform 452 and the chip carrier 414 as the lower adhesion frame 432 forms a floating via-seal 458 which extends across the tapered edge of the cushioning polymer cushion-frame 454 extending beyond the end of the edge of the body of the sealing structure 431, to a distal location remote from the cover adhesion frame 442 and the solder frame preform 452. Thus, the extension of the metal lower adhesion frame 432 beyond the edge of the cushion frame 454 decouples the solder frame preform 452 in the sealing structure 431 from the chip carrier 414.

Modeling has shown a very significant reduction in stress transmitted to the chip carrier, compared to a solid solder frame. For a particular case, 55% reduction in cool down stress, and 76% reduction in thermal cycle stress. The thickness of the cushion-frame need be no greater than 12 micrometers to effect stress decoupling, and probably can be as thin as 5 micrometers.

The x-y offset between the solder edge and the via-seal edge may be as little as 1 mm for effective stress coupling, and again, may be able to be even closer than that. This applies to all the embodiments.

Figure 5B:
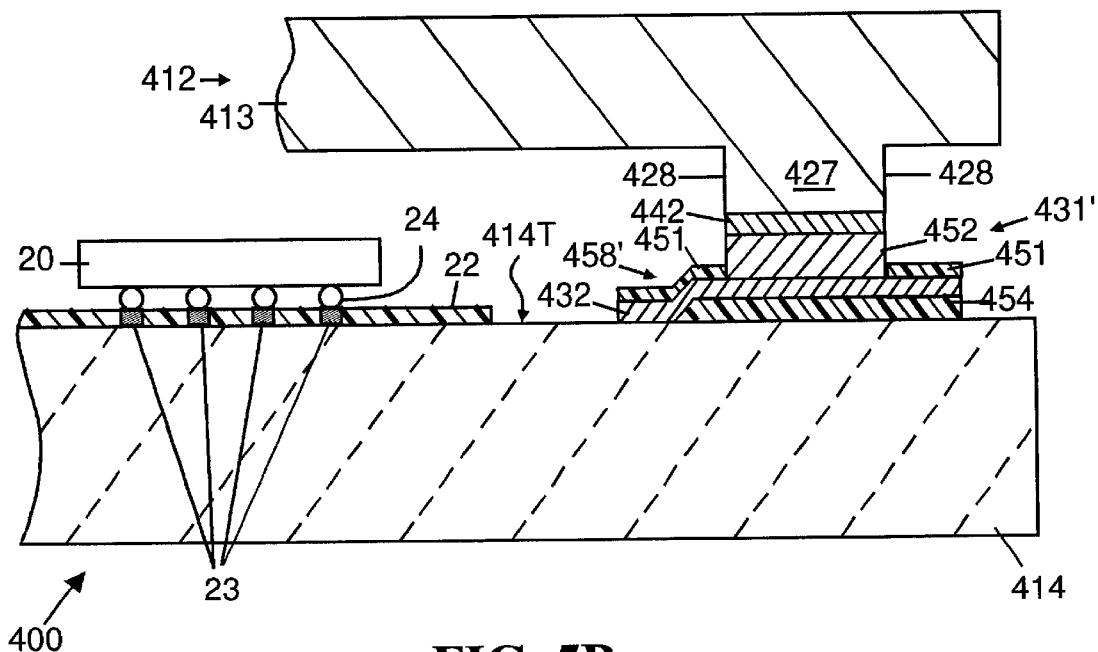
FIG. 5B shows a modification of the embodiment of FIG. 5A in which a solder seal is offset outboard from a metal/chip carrier contact via-seal. All of the elements of the module of FIG. 6 are otherwise the same as in FIG. 5.

FIG. 5B shows a modification of the embodiment of FIG. 5A in which a solder seal 431' is offset outboard from a metal/chip carrier contact via-seal 458' which is inside the cover 412. Note that the layer 432' reaches across the opposite end of layer 454'. A metal lower adhesion frame 432' is formed on the top surface of the cushion-frame 454' so that frame 432' reaches down inside the cover 412 to contact the surface 414T of the chip carrier 414. The cushion-frame 454', the metal lower adhesion frame 432', and the polymeric mask 451' are all reversed left to right All of the elements of the module of FIG. 5B are otherwise the same as in FIG. 5A.

Figure 6:
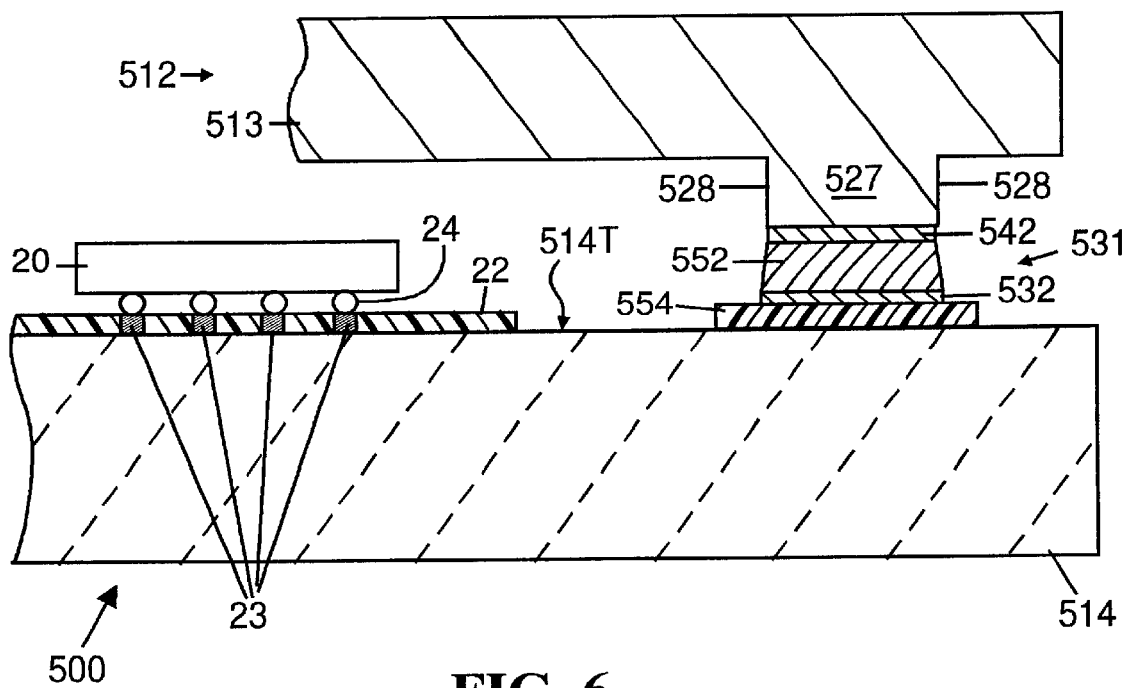
FIG. 6 shows a simple, "nearly hermetic" embodiment of the device of FIG. 2, with the ablated channel of FIGS. 3B and 4B and with the channel of FIG. 2 eliminated entirely.

FIG. 6 shows a simpler, "nearly hermetic" embodiment of the device of FIG. 2, which may be acceptable for many applications. Here the ablated channel 55C of FIG. 3B and the channel 155 of FIG. 2 are eliminated entirely. Hermeticity is slightly compromised only by the thin polymeric cushion frame 554 which is preferably a polymer such as polyimide PI.

The module 500 includes a chip carrier 514 and a chip cover 512 fragments of which are shown bonded together and sealed by a sealing structure 531 according to this invention.

The chip cover 512 has a top 513 and four vertical sides 527. The sides 527 have vertical sidewalls 528 which are joined to the chip carrier 514 by a hermetic sealing structure 531. The hermetic sealing structure 531 is formed between the sides 527 of cover 512 and the chip carrier 514, in accordance with this invention. A metal cover adhesion frame 542 is formed on the bottom of the vertical sides 527 of the cover 512. The metal cover adhesion frame 542 may be composed of layers comprising Ni-Au or another suitable combination, as described above.

The chip carrier 514 supports an interconnect structure 22 and chips 20 as described above. The soft, polymeric cushion-frame 554, as above, rests directly on the polished top surface of the chip carrier 514. A metal lower adhesion frame 532 is formed on the top surface of the cushion-frame 554. Frame 532 does not contact the chip carrier 514. The metal, lower adhesion frame 532 is preferably composed of Cr/Ni/Au adhesion layers or another suitable combination.

On the surface of the lower adhesion frame 532 a solder preform 552 has been placed upon the lower adhesion frame 532.

Then the cover 512 is positioned with the metal cover adhesion frame resting on the solder preform 552.

Then the module 500 is heated above the melting point of the preform 552 to provide a hermetically sealed bond between the metal lower adhesion frame 532 and the metal cover adhesion frame 442.

In this case there is no contact between solder 552 and the chip carrier 514 and there is no floating via-seal but the metal-ceramic CTE (Coefficient of Thermal Expansion) stresses are isolated by the soft, non-metallic layer 554 which nearly provides a hermetic seal.

The module 100 is tested for leaks with a helium (He) leak testing procedure at a rate of $5 \times 10^{-7}$ cc/sec of He.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a sealed electronic circuit package comprising:
   providing a ceramic chip carrier having a top surface and a cover having a mating surface confronting the top surface of the ceramic chip carrier,
   forming a seal at the peripheral edge of the ceramic chip carrier between the ceramic chip carrier having a top carrier surface, and the mating surface of the cover by the steps as follows:
      a) forming a peripheral non-metallic soft frame on the top surface of the chip carrier, the soft frame having a top soft frame surface which faces upwardly,
      b) providing a cover frame surface on the mating surface of the cover which is exposed downwardly,
      c) forming a lower adhesion frame over the soft frame hermetically sealed to the ceramic chip carrier, and
      d) joining the top surface of the lower adhesion frame and the cover frame surface with solder reaching to the top surface of the chip carrier to form a hermetic via-seal between the cover frame surface and the top carrier surface of the ceramic chip carrier.

2. The method of claim 1 with the via-seal being located laterally aside from the confronting portions of the surfaces of the cover and the ceramic chip carrier.

3. The method of claim 1 with the via-seal being exposed on the surface of the soft layer on an exterior surface of the peripheral frame.

4. The method of claim 1 with the seal being a via-seal being exposed on the surface of the soft layer on an interior surface of the peripheral frame.

5. The method of claim 1 with the ceramic chip carrier being a ceramic chip carrier and the soft layer being a polymer.

6. The method of claim 1 with the ceramic chip carrier being a ceramic chip carrier and the soft layer being a polyimide polymer.

7. The method of claim 1 with the ceramic chip carrier being a glass ceramic chip carrier and the soft layer being a polymer.

8. The method of claim 1 with the ceramic chip carrier being a glass ceramic chip carrier and the soft layer being a polyimide polymer.

9. The method of claim 1 with the ceramic chip carrier being a glass ceramic chip carrier and the soft layer being a polyimide polymer and the lower adhesion frame is composed of laminated Cr-Ni-Au layers.

10. The method of claim 1 with the soft layer has a thickness less than or equal to about 12 μm.

11. The method of claim 1 including:

forming the non-metallic soft frame with a central channel extending down through the non-metallic soft layer to expose a portion of the frame surface below the channel with the lower adhesion frame extending down through the channel formed in the non-metallic soft layer to contact the top carrier surface of the ceramic chip carrier, whereby the hermetic via-seal extends through the channel to the ceramic chip carrier frame surface to form a seal between the cover frame surface and the ceramic chip carrier.

12. The method of claim 1 wherein the solder has a melting point 30° C. to 40° C. below the melting point of C4 below the softening point of any solders or polymers inside the package.

13. The method of claim 1 wherein the solder is selected from the group consisting of an (SnAg or a SnAgCu solder with about 96%Sn) or a two-material (lead/tin eutectic) solder.

14. The method of claim 1 including:

forming the lower adhesion frame with an extension across the edge of the non-metallic soft layer to contact the top carrier surface of the ceramic chip carrier at a distal location, whereby the hermetic via-seal extends across the edge of the soft layer to form a seal between the cover frame surface and the substrate.

15. A method of forming a sealed electronic circuit package comprising:

providing a ceramic chip carrier having a top surface and a cover having a mating surface confronting the top surface of the ceramic chip carrier, forming a seal at the peripheral edge of the ceramic chip carrier between the ceramic chip carrier and the mating surface of the cover by the steps as follows:

a) forming a peripheral non-metallic soft frame formed on the top surface of the ceramic chip carrier having a top soft frame surface which faces upwardly with a central channel formed down through the non-metallic soft layer to expose a portion of the top surface of the ceramic chip carrier below the channel, b) forming a cover frame for providing adhesion formed on the mating surface of the cover, the cover frame having a cover frame surface which is exposed downwardly, c) forming a lower adhesion frame over the soft frame extending down through the channel formed in the non-metallic soft layer to contact the top surface of the ceramic chip carrier, and d) joining the top surface of the lower adhesion frame and the cover frame surface with solder and extending into the channel to form a hermetic via-seal through the channel to the ceramic chip carrier frame surface forming a seal between the cover frame surface and the ceramic chip carrier extending through the channel in the soft frame.

16. The method of claim 15 wherein the solder has a melting point 30° C. to 40° C. below the melting point of C4 below the softening point of any solders or polymers inside the package.

17. The method of claim 15 wherein the solder is selected from the group consisting of an (SnAg or a SnAgCu solder with about 96%Sn) or a two-material (lead/tin eutectic) solder.

18. A method of forming a sealed electronic circuit package comprising:

providing a ceramic chip carrier having a top surface and a cover having a mating surface confronting the top surface of the ceramic chip carrier, forming a seal at the peripheral edge of the ceramic chip carrier between the ceramic chip carrier and the mating surface of the cover by the steps as follows:

a) forming a peripheral non-metallic soft frame on the top surface of the ceramic chip carrier having a top soft frame surface which faces upwardly, b) forming a cover frame for providing adhesion formed on the mating surface of the cover, the cover frame having a cover frame surface which is exposed downwardly, c) forming a lower adhesion frame over the soft frame, and d) joining the top surface of the lower adhesion frame and the cover frame surface with solder to form a hermetic seal.

19. The method of claim 18 wherein the solder has a melting point 30° C. to 40° C. below the melting point of C4 below the softening point of any solders or polymers inside the package.

20. The method of claim 18 wherein the solder is selected from the group consisting of an (SnAg or a SnAgCu solder with about 96%Sn) or a two-material (lead/tin eutectic) solder.

* * * * *